(12) United States Patent
Lee

(10) Patent No.: US 7,129,524 B2
(45) Date of Patent: Oct. 31, 2006

(54) ORGANIC ELECTROLUMINESCENT DEVICE AND METHOD FOR FABRICATING THE SAME

(75) Inventor: Kuo-Sheng Lee, Yongkang (TW)

(73) Assignee: AU Optronics Corp., Hsinchu (TW)

( * ) Notice: Subject to any disclaimer, the term of this patent is extended or adjusted under 35 U.S.C. 154(b) by 104 days.

(21) Appl. No.: 11/067,981

(22) Filed: Feb. 28, 2005

(65) Prior Publication Data

US 2006/0061290 A1 Mar. 23, 2006

(30) Foreign Application Priority Data

Sep. 23, 2004 (TW) .............................. 93128824 A

(51) Int. Cl.
*H01L 29/04* (2006.01)
*G09G 3/36* (2006.01)

(52) U.S. Cl. .................... 257/59; 257/72; 257/98; 257/79; 345/92; 345/91; 345/84

(58) Field of Classification Search .................... None
See application file for complete search history.

(56) References Cited

U.S. PATENT DOCUMENTS

| 6,794,675 | B1 * | 9/2004 | Suzuki et al. ................ 257/40 |
| 2003/0170433 | A1 * | 9/2003 | Hasegawa et al. .......... 428/209 |
| 2005/0017929 | A1 * | 1/2005 | Sano et al. .................. 345/76 |
| 2005/0057460 | A1 * | 3/2005 | Lee et al. .................... 345/76 |

* cited by examiner

*Primary Examiner*—Tuyet Thi Vo
(74) *Attorney, Agent, or Firm*—Thomas, Kayden, Horstemeyer & Risley

(57) ABSTRACT

An organic electroluminescent device comprising a thin film transistor (TFT), an organic light-emitting diode (OLED), and a capacitor. The TFT is disposed in a non-emitting region of a substrate. An insulating layer is formed on the substrate and covers the switch TFT. The OLED having a top electrode and a bottom electrode is disposed on the insulating layer in an emitting region of the substrate. The capacitor having a top electrode and a bottom electrode is disposed on the insulating layer in the non-emitting region of the substrate and electrically connected to the TFT. The top electrode of the OLED and the top electrode of the capacitor are formed of a patterned conductive layer. A method of fabricating the organic electroluminescent device is also disclosed.

16 Claims, 7 Drawing Sheets

US 7,129,524 B2

ORGANIC ELECTROLUMINESCENT DEVICE AND METHOD FOR FABRICATING THE SAME

BACKGROUND

The invention relates to an organic electroluminescent device and in particular to an organic electroluminescent device with a capacitor overlying a transistor and method for fabricating the same.

Current electronic display products include, for example, cathode ray tubes (CRTs), liquid crystal displays (LCDs), plasma display panels (PDPs), and organic light emitting diodes (OLEDs). Among flat panel displays, OLEDs have the following advantages: light emission, high luminous efficiency, wide viewing angle, fast response time, high reliability, full color, low driving voltage, low power consumption, and simple fabrication. In a conventional passive organic luminescent device, the resolution is low and suitable only for a small-area and low-resolution display device. Conversely, an active organic luminescent device using thin film transistors (TFTs) in an active-addressing scheme has high resolution and low power consumption.

FIG. 1 is a schematic diagram of a pixel of a conventional active matrix OEL device. The pixel comprises a switch TFT 107, a drive TFT 109, a capacitor 111, and an organic light-emitting diode (OLED) 113. Gate, source, and drain electrodes of the switch TFT 107 are electrically connected to a scan line 101, a data line 103, and the capacitor 111, respectively. Gate, source, and drain electrodes of the drive TFT 109 are electrically connected to the drain electrode of the switch TFT 107, a $V_{dd}$ line 105, and the OLED 113, respectively. When the scan line 101 is driven, the switch TFT 107 is switched on and the signal from the data line 103 is input into the capacitor 111. After the capacitor 111 is charged, the $V_{dd}$ line 105 supplies a current to drive the OLED 113 according to the I-V characteristic of the drive TFT 109 and the voltage level of the capacitor 111.

FIG. 2 is a cross-section of a pixel structure of a conventional OEL device. In this structure, a switch TFT 107 is disposed on a substrate 100, comprising an active layer 102 with source and drain regions 102a and 102b, a gate dielectric layer 104, a gate electrode 106, a source electrode 110a, and a drain electrode 110b. An interlayer dielectric (ILD) layer 108 is disposed on the gate dielectric layer 104 and covers the gate electrode 106. A capacitor 111 is disposed on the substrate 100 outside of the switch TFT 107, comprising a bottom palate 110b (the drain electrode of the switch TFT 107), a passivation layer 112 serving as a capacitor dielectric layer, and a top electrode 114 electrically connected to a $V_{dd}$ line 105. An insulating (passivation) layer 116 is disposed on the capacitor dielectric layer 112 and covers the top electrode 114. An OLED 113 is disposed on the substrate 100 outside of the TFT 107 and the capacitor 111, comprising a bottom electrode (not shown), an electroluminescent medium layer 118, and top electrode 120. Such a capacitor 111 arrangement occupies a portion of active area of the OLED 113, reducing the aperture ratio of the OEL device. In order to increase device resolution, the pixel size must be reduced, thus further increasing the occupied area of the capacitor. As a result, the aperture ratio of the OEL device is further reduced, such that the lifetime of the OEL device is reduced.

SUMMARY

An organic electroluminescent device and a method for fabricating the same are provided. An embodiment of an organic electroluminescent device comprises a substrate, a TFT, an insulating layer, an OLED, and a capacitor. The substrate has a non-emitting region and an emitting region defined thereon. The TFT is disposed in a non-emitting region. The insulating layer is formed on the substrate and covers the TFT. The OLED having a top electrode and a bottom electrode is disposed on the insulating layer in an emitting region. The capacitor having a top electrode and a bottom electrode is disposed on the insulating layer in the non-emitting region (or over the TFT) and electrically connected to the switch TFT. The top electrode of the OLED and the top electrode of the capacitor are formed of a patterned conductive layer.

An embodiment of a method comprises providing a substrate having non-emitting and emitting regions defined thereon. A TFT is formed in the non-emitting region. A first insulating layer is formed on the substrate and covers the TFT. A bottom electrode is formed on the first insulating layer in the non-emitting region (or over the TFT) and the emitting region, so that the bottom electrode in non-emitting region is electrically connected to the TFT. A second insulating layer is formed on the first insulating layer to cover the bottom electrode in the non-emitting region (or over the TFT) and to expose the bottom electrode in the emitting region. An organic electroluminescent medium layer is formed on the second insulating layer in the emitting region to cover the exposed bottom electrode. A top electrode is formed on the second insulating layer in the non-emitting region (or over the TFT) and on the organic electroluminescent medium layer in the emitting region, respectively.

DESCRIPTION OF THE DRAWINGS

An organic electroluminescent device and a method for fabricating the same will become more fully understood from the detailed description given hereinbelow and the accompanying drawings, given by way of illustration only and thus not intended to be limitative of the invention.

FIG. 3F-1 is a cross-section of an embodiment of an organic electroluminescent device of the invention.

DETAILED DESCRIPTION

Figure 1:
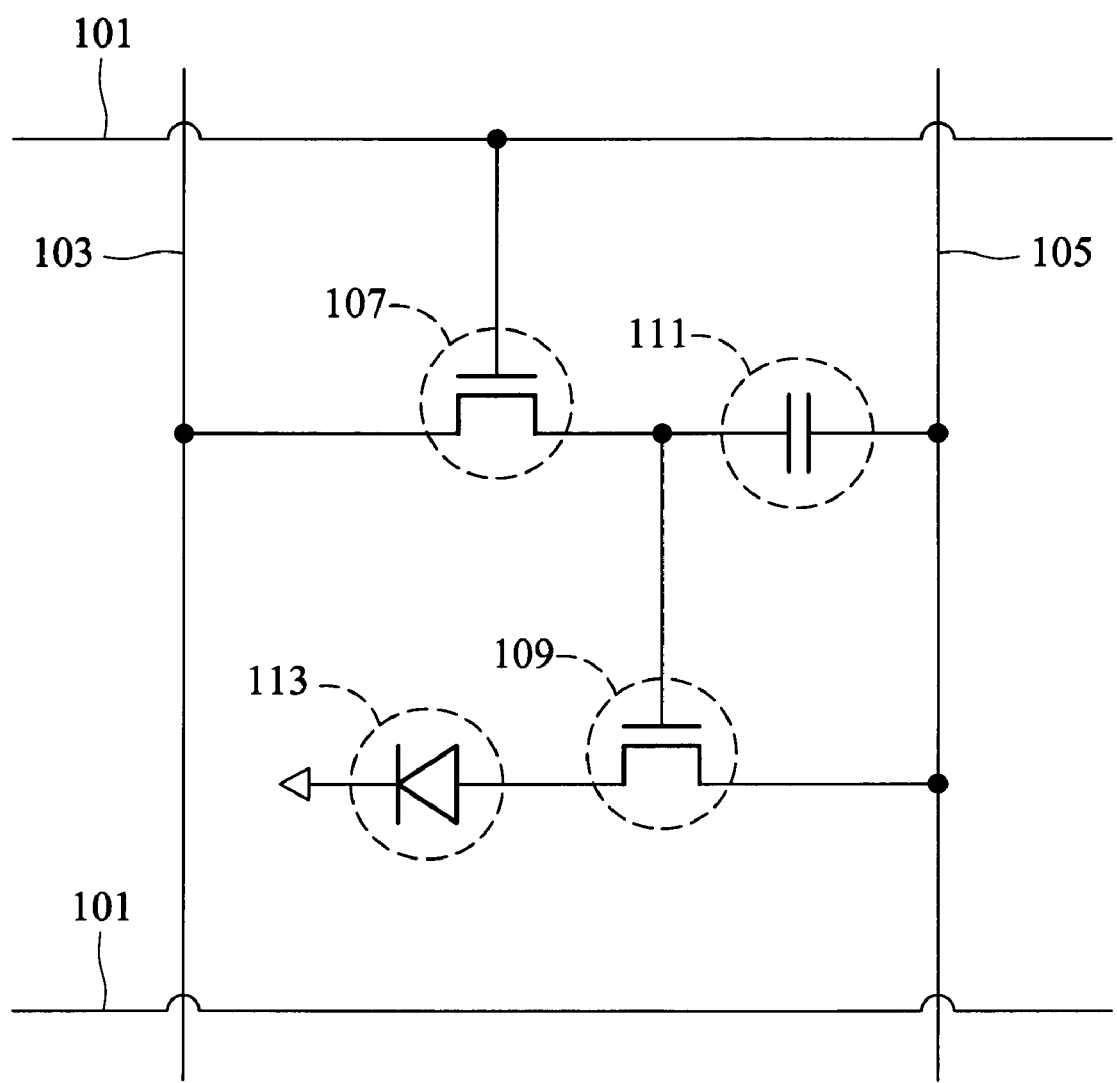
FIG. 1 is a schematic diagram of a pixel of a conventional active matrix OEL device.
Figure 2:
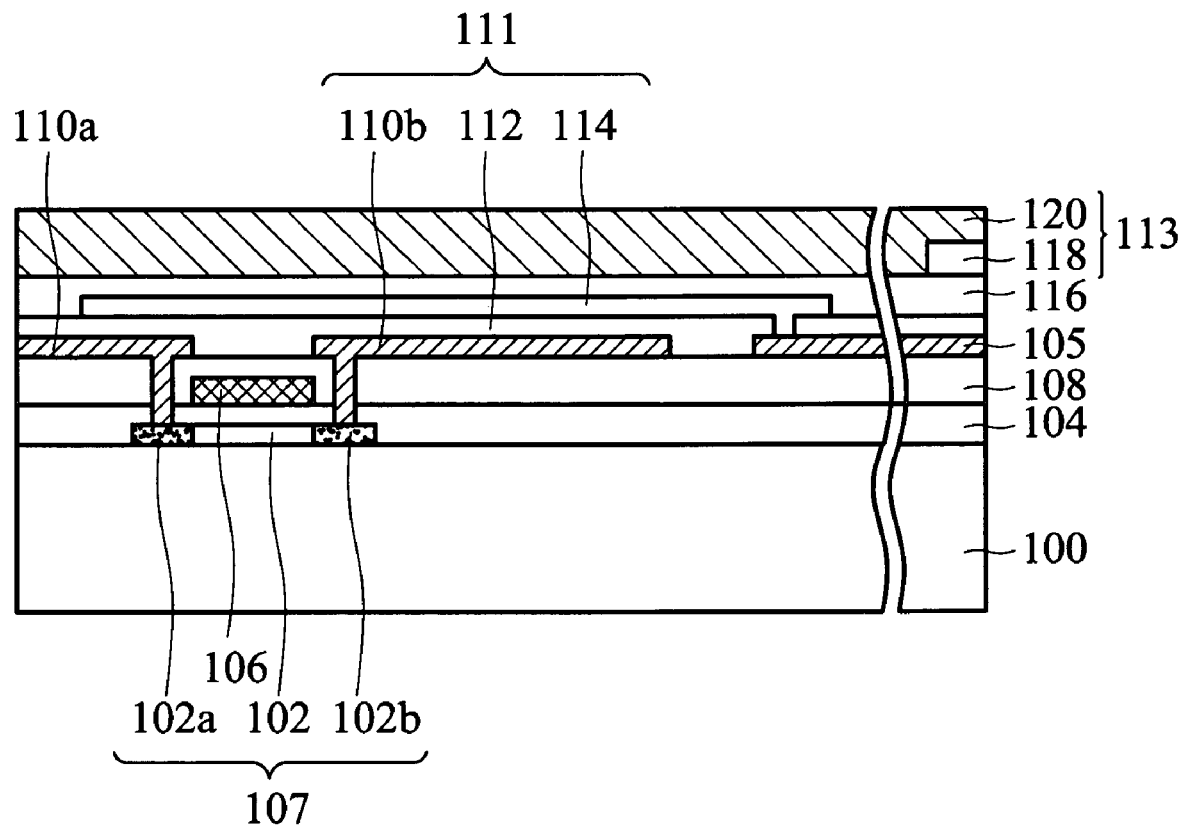
FIG. 2 is a cross-section of a pixel structure of a conventional OEL device.

An organic electroluminescent device and a method for fabricating the same will be described in greater detail in the following. FIG. 3F illustrates an embodiment of an organic electroluminescent device. The device comprises a substrate 200 having a first region 10 and a second region 20 defined thereon, a TFT 207, an insulating layer 214, a light-emitting diode 213, and a capacitor 211. The substrate 200 may have a non-emitting region 10 and an emitting region 20 defined thereon. Here, the non-emitting region 10 indicates a region where data lines, scan lines, $V_{dd}$ lines, TFTs, and capacitors are formed therein. Moreover, the emitting region 20 indicates a pixel region where a passivation layer is removed and an organic electroluminescent medium layer is formed therein. The TFT 207, such as a switch TFT, is disposed in the non-emitting region 10 of the substrate 200, comprising an active layer 204 comprising source and drain doping regions 202a and 202b, a gate dielectric layer 204, a gate electrode 206, and source and drain electrodes 212a and 212b. An interlayer dielectric (ILD) layer 210 is disposed on the gate dielectric layer 204 and covers the gate electrode 206. The insulating layer 214 is disposed on the interlayer dielectric layer 210 in the emitting region 20 of the substrate 200 and covers the switch TFT 207 in the non-emitting region 10 of the substrate 200. Moreover, the insulating layer 214 comprises an opening to expose a drain electrode 212b. The OLED 213 and the capacitor 211 are respectively disposed on the insulating layer 214 in the emitting region 20 and the non-emitting region 10. Moreover, the capacitor 211 is electrically connected to the switch TFT 207, serving as a storage capacitor. The capacitor 211 preferably disposed on the insulating layer 214 over the switch TFT 207, comprising a bottom electrode 216a, an insulating (passivation) layer 218 serving as a capacitor dielectric, and a top electrode 222. The OLED 213 comprises a bottom electrode 216b, a top electrode 222, and an organic electroluminescent medium layer 220 sandwiched therebetween.

In this embodiment, the top electrode of the OLED 213 and the top electrode of the capacitor 211 are formed of a patterned conductive layer 222. Preferably, the top electrodes of the OLED 213 and the capacitor 211 comprise a continuous conductive layer 222 comprising an opaque material, such as a metal layer. Moreover, the bottom electrode 216b of the OLED 213 and the bottom electrode 216a of the capacitor 211 are also formed of a patterned conductive layer comprising a transparent material, such as an indium tin oxide (ITO) layer. The organic electroluminescent medium layer 220 of the OLED 213 may extend under the top electrode 222 of the capacitor 211, such that the top electrode 222 of the capacitor 211 at least partially overlaps the organic electroluminescent medium layer 220. Additionally, the top electrode 222 of the capacitor 211 may fully overlap the underlying organic electroluminescent medium layer 220, as shown in FIG. 3F-1.

Figure 3A:
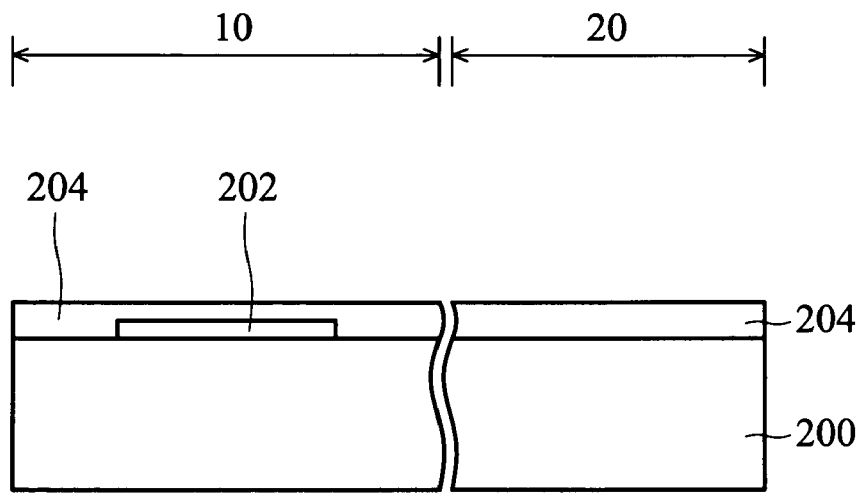
FIGS. 3A to 3F are cross-sections of an embodiment of a method for fabricating an organic electroluminescent device of the invention.
Figure 3B:
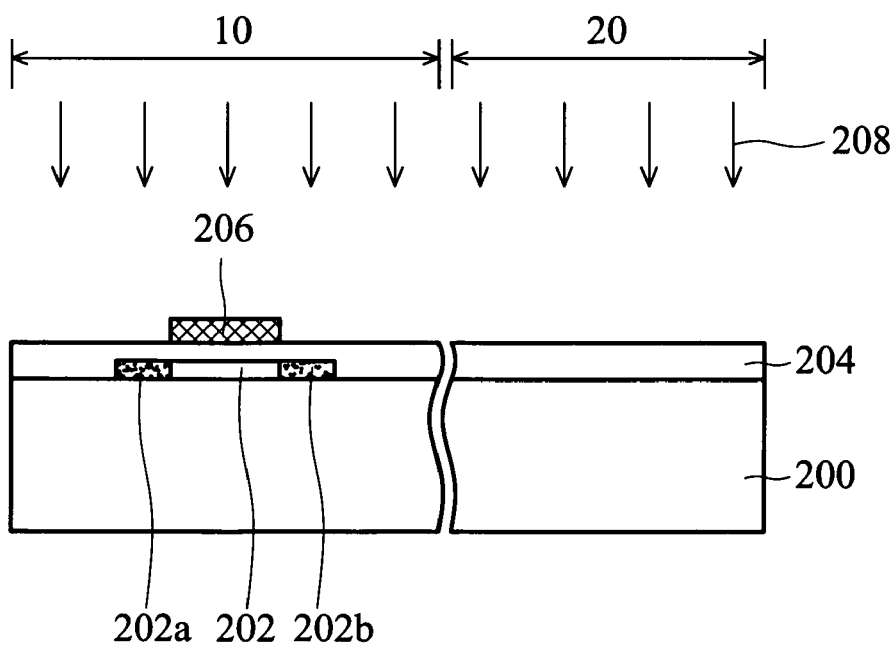
Figure 3C:
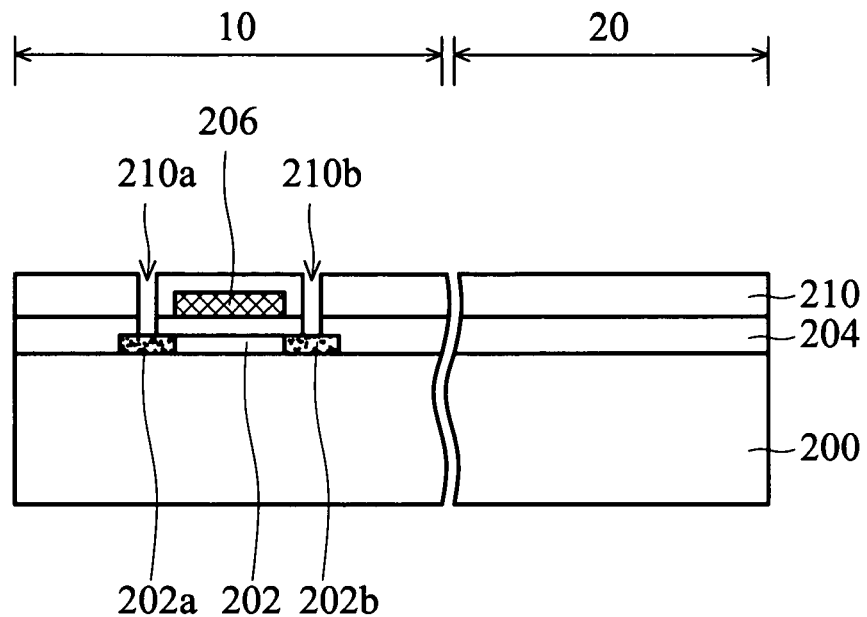
Figure 3D:
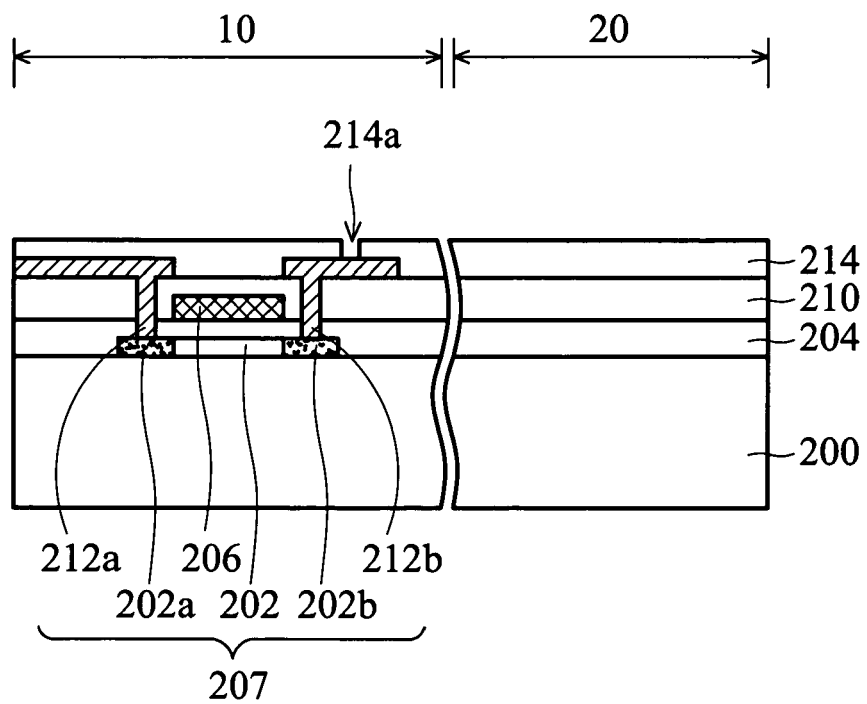
Figure 3E:
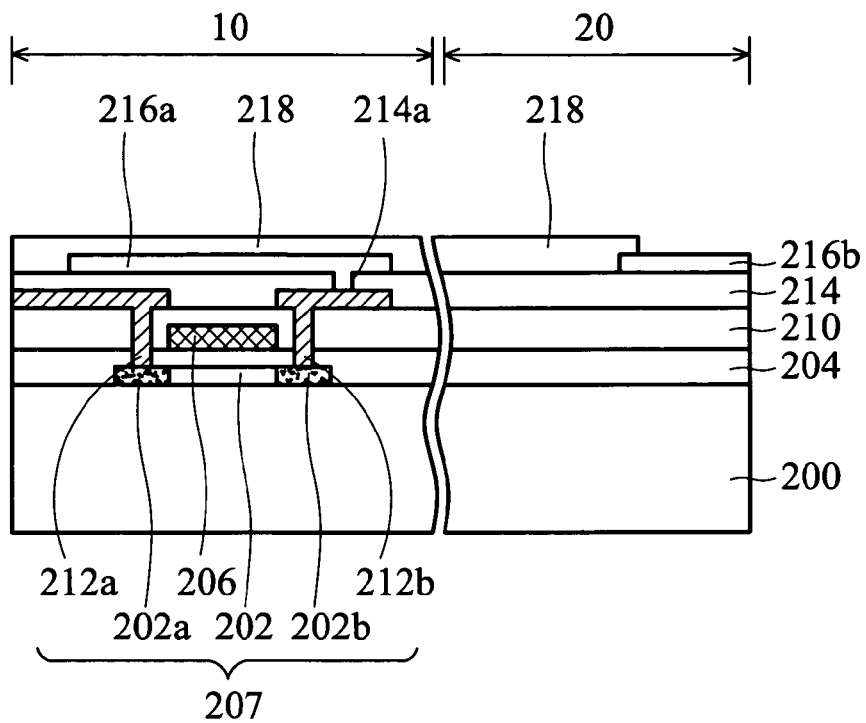
Figure 3F:
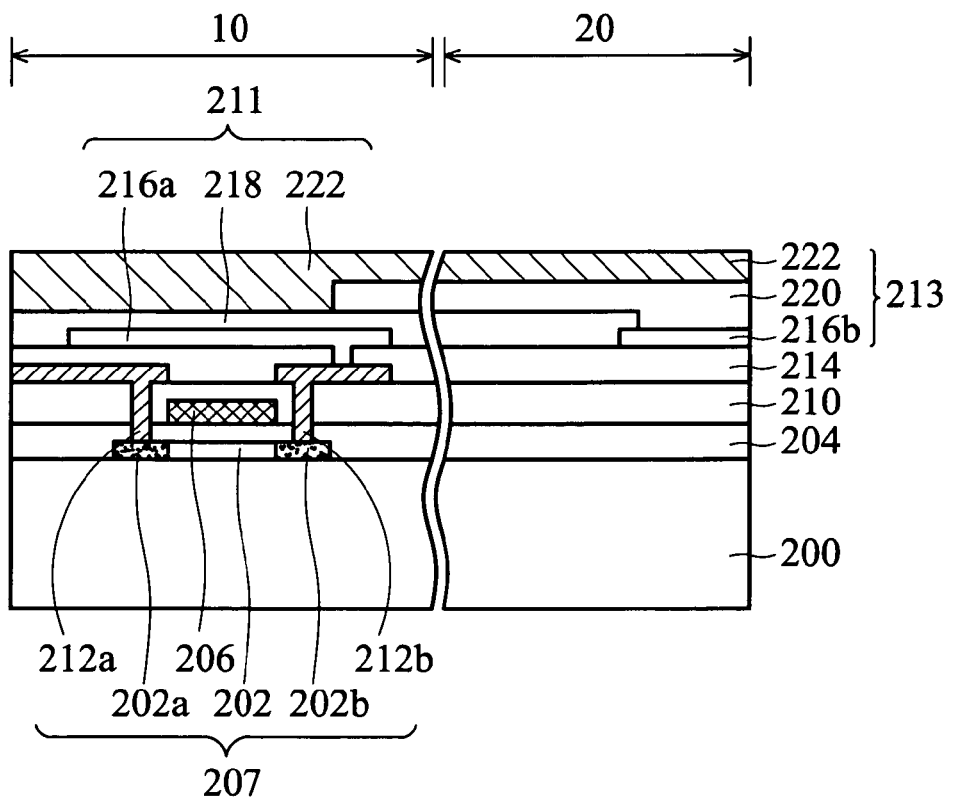
Figures 1, 3F:
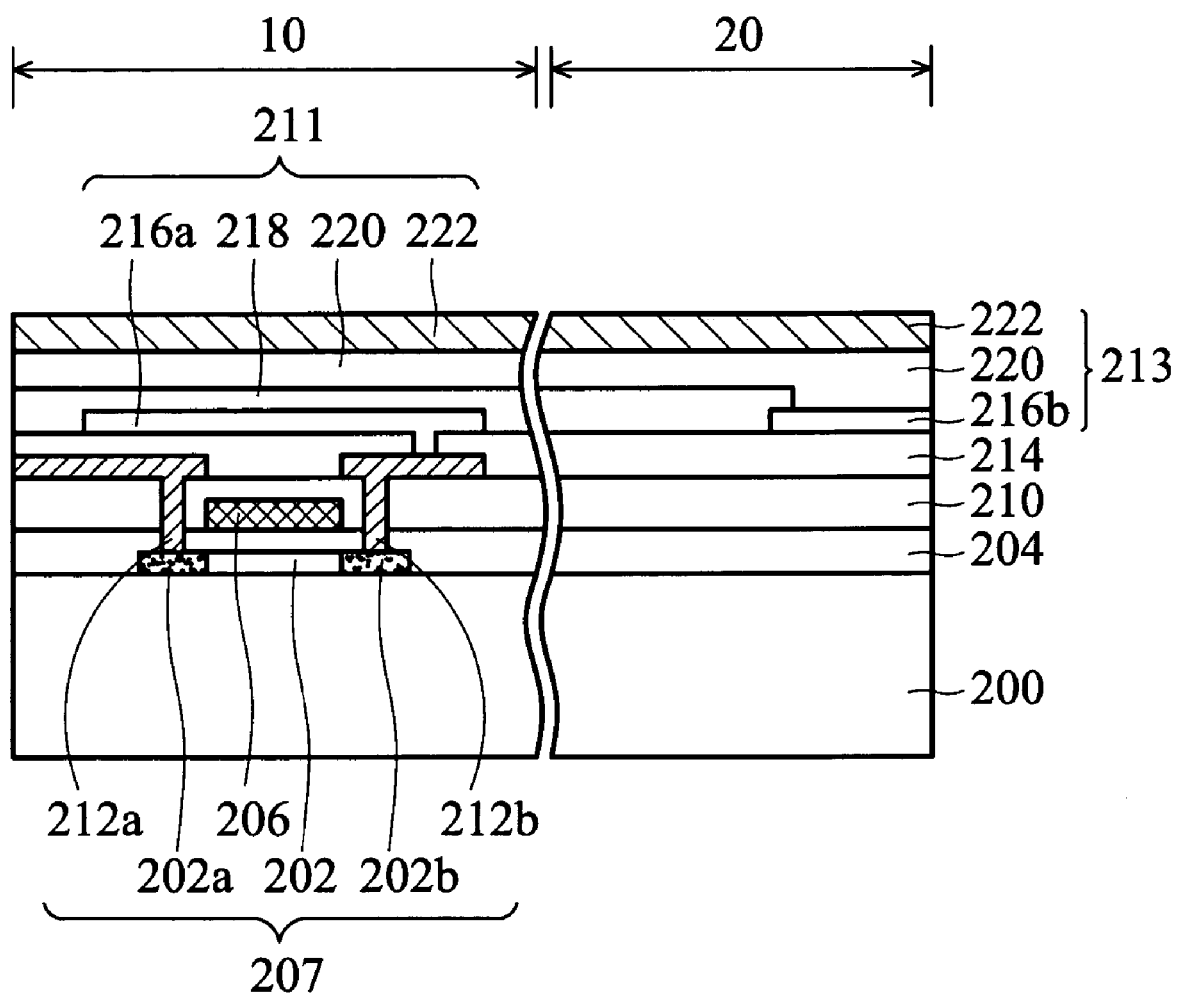

FIGS. 3A to 3F are cross-sections of an embodiment of a method for fabricating an organic electroluminescent device. As shown in FIG. 3A, a substrate 200, such as a glass, quartz, or plastic substrate, has a non-emitting region 10 and an emitting region 20 defined thereon for forming a TFT and an OLED therein, respectively. A semiconductor layer (not shown) is formed on the substrate 200 and then patterned by conventional lithography and etching to form a semiconductor pattern layer 202 in the non-emitting region 10 of the substrate 200, serving as an active layer of a TFT. An insulating layer 204, such as a silicon nitride layer, is formed on the substrate 200 and covers the active layer 202, serving the gate dielectric layer of the TFT.

As shown in FIG. 3B, a conductive layer (not shown), such as a metal layer, is formed on the insulating layer 204 and then patterned by lithography and etching to form a conductive pattern layer 206 on the non-emitting region 10 of the substrate 200, serving as the gate electrode of the TFT. Source and drain doping regions 202a and 202b are formed by ion implantation of the active layer 202 using the gate electrode 206 as a mask.

An interlayer dielectric (ILD) layer 210 is deposited on the substrate shown in FIG. 3B. Contact holes are subsequently formed on both sides of the gate electrode 206 by etching the interlayer dielectric layer 210 and the underlying insulating layer 206, exposing the source and drain doping regions 202a and 202b, as shown in FIG. 3C.

As shown in FIG. 3D, a metal layer (not shown) is formed on the interlayer dielectric layer 210 and fills the contact holes to electrically connect to the source and drain doping regions 202a and 202b. Thereafter, the metal layer is patterned by lithography and etching to form source and drain electrodes 212a and 212b, thus the fabrication of a TFT 207, such as a switch TFT, is completed in the non-emitting region 10 of the substrate 200. An interlayer insulator 214 is deposited on the interlayer dielectric layer 210 in the non-emitting and emitting regions 10 and 20 of the substrate 200 and covers the switch TFT 207, serving as a planarization layer. An opening 214a is formed in the interlayer insulator 214 to expose the drain electrode 212b.

As shown in FIG. 3E, bottom electrodes 216a and 216b are formed on the interlayer insulator 214 in the non-emitting region 10 and the emitting region 20, respectively, wherein the bottom electrode 216a is electrically connected to the TFT 207. The bottom electrode 216a is preferably formed on the interlayer insulator 214 over the TFT 207. For example, a conductive layer (not shown) may be formed on the interlayer insulator 214 and fill the opening 214a, thereby electrically connecting to the drain electrode 212b. In this embodiment, the conductive layer may comprise a transparent conductive layer, such as an ITO layer. Thereafter, the conductive layer is patterned by lithography and etching to simultaneously form the bottom electrode 216a over the TFT 207 in the non-emitting region 10 and the bottom electrode 216b on the interlayer insulator 214 in the emitting region 20. Here, the bottom electrode 216a serves as the bottom electrode of a capacitor and the bottom electrode 216b as the bottom electrode of an OLED. An insulating (passivation) layer 218 is formed on the interlayer insulator 214, serving as a capacitor dielectric layer, covering the bottom electrode 216a in the non-emitting region 10 and exposing the bottom electrode 216b in the emitting region 20.

As shown in FIG. 3F, an organic electroluminescent medium layer 220 is formed on the insulating layer 218 in the emitting region 20 to cover the exposed bottom electrode 216b. The organic electroluminescent medium layer 220 may comprise a hole transport layer (HTL), an electron transport layer (ETL), and an active or emissive layer sandwiched between HTL and ETL. Here, in order to simplify the diagram, only a single layer is depicted. A top electrode is respectively formed on the insulating layer 218 in the non-emitting region 10 and on the organic electroluminescent medium layer 220 in the emitting region 20, thus fabrication of a capacitor 211 over the TFT 207 and an OLED 213 in the emitting region 20 is completed. In this embodiment, top electrodes of the OLED 213 and the capacitor 211 are formed of a patterned conductive layer 222. Preferably, top electrodes of the OLED 213 and the capacitor 211 comprise a continuous conductive layer comprising an opaque material, such as a metal layer.

In some embodiments, the organic electroluminescent medium layer 220 may extend across the non-emitting region 10, such that the subsequent top electrode 222 of the capacitor 211 fully overlaps thereof, as shown in FIG. 3F-1.

Figure 4:
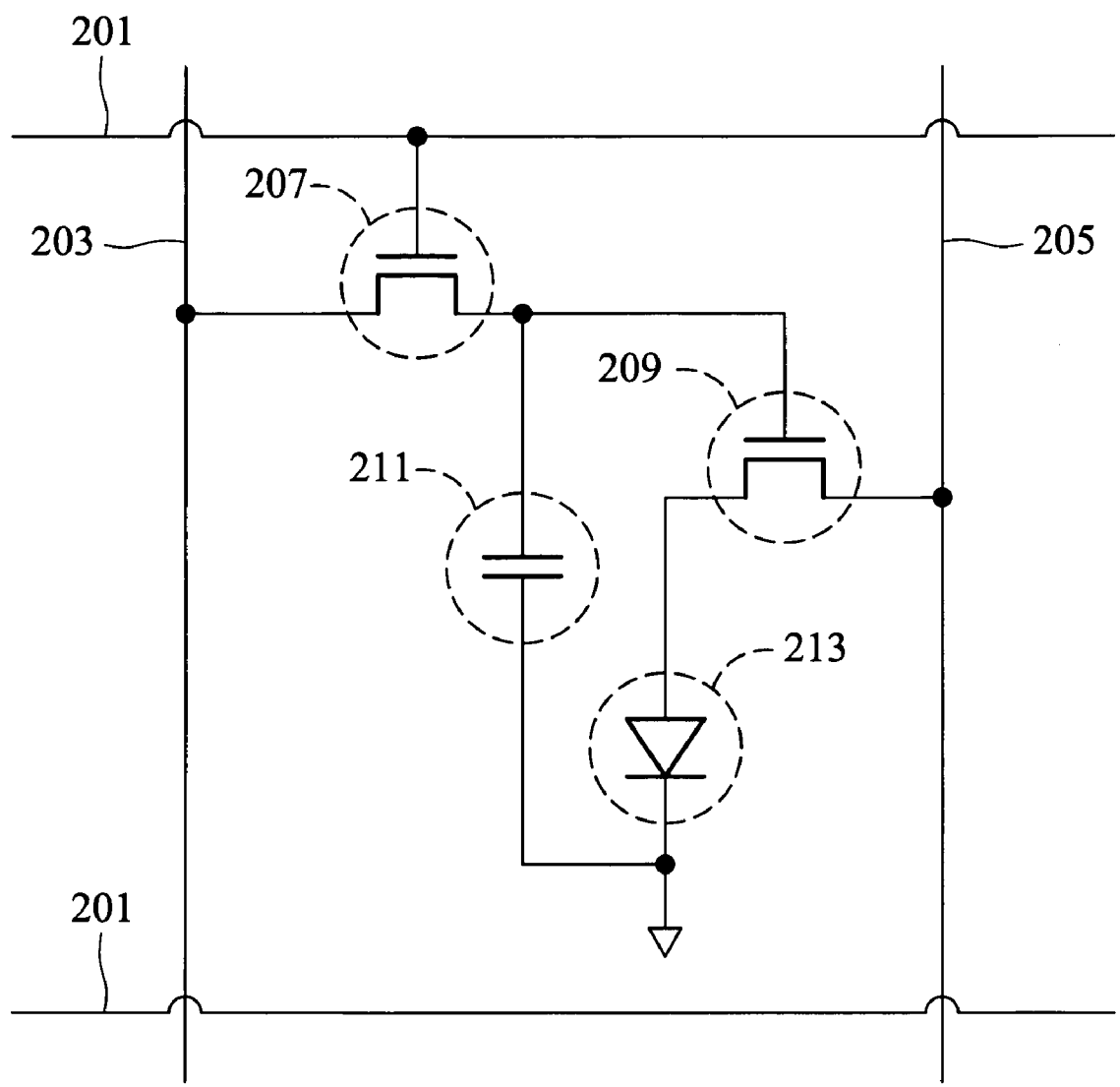
FIG. 4 is a schematic diagram of a pixel of an embodiment of an active matrix OEL device of the invention.

FIG. 4 is a schematic diagram of a pixel of an embodiment of an active matrix OEL device of the invention. The pixel comprises a first TFT 207, a second TFT 209, a capacitor 211, and an OLED 213. Gate, source, and drain electrodes of the first TFT 207 are electrically connected to a scan line 201, a data line 203, and one of two terminals of the capacitor 211, respectively. Gate, source, and drain electrodes of the second TFT 209 are electrically connected to the drain electrode of the first TFT 207, a $V_{dd}$ line 205, and one of two terminals of the OLED 213. The other terminal of the capacitor 211 and that of the OLED 213 may be connected to the same terminal with fixed voltage level, such as a ground terminal.

According to the organic electroluminescent device, the occupied area of the capacitor 211 can be reduced to increase aperture ratio and extend device lifetime since the capacitor 211 is disposed over the first TFT 207. Moreover, since bottom electrodes 216a and 216b of the capacitor 211 and the OLED 213 are formed of a patterned conductive layer and the top electrodes of them also formed of another patterned conductive layer 222, the fabrication process can be simplified.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. An organic electroluminescent device, comprising:
   a substrate having a non-emitting region and an emitting region defined thereon;
   a thin film transistor disposed in the non-emitting region;
   an insulating layer formed on the substrate and covering the thin film transistor;
   an organic light-emitting diode, having a top electrode and a bottom electrode, disposed on the insulating layer in the emitting region; and
   a capacitor, having a top electrode and a bottom electrode, disposed on the insulating layer in the non-emitting region and electrically connected to the thin film transistor;
   wherein the top electrode of the organic light-emitting diode and the top electrode of the capacitor are formed of a patterned conductive layer.

2. The device as claimed in claim 1, wherein the patterned conductive layer comprises a continuous conductive layer.

3. The device as claimed in claim 1, wherein the top electrode of the capacitor comprises an opaque conductive layer.

4. The device as claimed in claim 1, wherein the bottom electrode of the organic light-emitting diode and the bottom electrode of the capacitor are formed of a patterned conductive layer.

5. The device as claimed in claim 1, wherein the bottom electrode of the capacitor comprises a transparent conductive layer.

6. The device as claimed in claim 1, wherein the capacitor is disposed on the insulating layer over the thin film transistor.

7. The device as claimed in claim 1, further comprising an organic electroluminescent medium layer underlying the top electrode of the capacitor.

8. The device as claimed in claim 7, wherein the top electrode of the capacitor at least partially overlaps the underlying organic electroluminescent medium layer.

9. A method for fabricating an organic electroluminescent device, comprising:
   providing a substrate having a non-emitting region and an emitting region defined thereon;
   forming a thin film transistor in the non-emitting region;
   forming a first insulating layer on the substrate so as to cover the thin film transistor;
   forming a bottom electrode on the first insulating layer in the non-emitting region and the emitting region, so that the bottom electrode in non-emitting region is electrically connected to the thin film transistor;
   forming a second insulating layer on the first insulating layer to cover the bottom electrode in the non-emitting region and to expose the bottom electrode in the emitting region;
   forming an organic electroluminescent medium layer on the second insulating layer in the emitting region to cover the exposed bottom electrode; and
   forming a top electrode on the second insulating layer in the non-emitting region and on the organic electroluminescent medium layer in the emitting region, respectively.

10. The method as claimed in claim 9, wherein the step of forming an organic electroluminescent medium layer further comprising forming the organic electroluminescent medium layer over the thin film transistor to at least partially overlap the top electrode of the capacitor.

11. The method as claimed in claim 9, wherein the bottom electrode in the non-emitting region is formed over the thin film transistor.

12. The method as claimed in claim 9, wherein the bottom electrode of the light-emitting diode and the bottom electrode of the capacitor are formed of a patterned conductive layer.

13. The method as claimed in claim 12, wherein the bottom electrode of the capacitor comprises a transparent conductive layer.

14. The method as claimed in claim 9, wherein the top electrode of the light-emitting diode and the top electrode of the capacitor are formed of a patterned conductive layer.

15. The method as claimed in claim 14, wherein the top electrode of the capacitor comprises an opaque conductive layer.

16. The method as claimed in claim 14, wherein the patterned conductive layer comprises a continuous conductive layer.

* * * * *